(12) United States Patent
Bolken

(10) Patent No.: US 7,279,366 B2
(45) Date of Patent: *Oct. 9, 2007

(54) METHOD FOR ASSEMBLING SEMICONDUCTOR DIE PACKAGES WITH STANDARD BALL GRID ARRAY FOOTPRINT

(75) Inventor: Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/168,776

(22) Filed: Jun. 28, 2005

(65) Prior Publication Data
US 2005/0255637 A1   Nov. 17, 2005

Related U.S. Application Data

(60) Continuation of application No. 10/133,250, filed on Apr. 26, 2002, now Pat. No. 6,939,746, which is a division of application No. 09/934,278, filed on Aug. 21, 2001, now Pat. No. 6,573,592.

(51) Int. Cl.
*H01L 21/00* (2006.01)
*H01L 23/48* (2006.01)
*H05K 13/00* (2006.01)

(52) U.S. Cl. .......... 438/125; 438/127; 438/612; 29/856; 257/786

(58) Field of Classification Search ............ None
See application file for complete search history.

(56) References Cited

U.S. PATENT DOCUMENTS 5,019,673 A   5/1991   Juskey et al.
5,258,648 A   11/1993  Lin
5,376,584 A * 12/1994  Agarwala ............ 438/614

(Continued)

FOREIGN PATENT DOCUMENTS

JP   02087637 A * 3/1990

(Continued)

OTHER PUBLICATIONS

Han et al., "Study on the Pressurized Underfill Encapsulation of Flip-Chips", pp. 1-24, May 30, 2001, http://www.nanoflow.com/Paper/FlipProc/flippnn.htm.

*Primary Examiner*—Alonzo Chambliss
(74) *Attorney, Agent, or Firm*—TraskBritt

(57) ABSTRACT

Apparatus and methods for forming semiconductor assemblies. An interposer includes a perimeter wall surrounding at least a portion of an upper surface thereof to form a recess. An array of electrical connection pads is located within the recess. A semiconductor die can be flip chip attached to the interposer by at least partial insertion of the semiconductor die within the recess with discrete conductive elements between bond pads of the semiconductor die and electrical connection pads of the interposer. The electrical connection pads communicate with a number of other electrical contact pads accessible elsewhere on the interposer, preferably on a lower surface thereof. A low viscosity underfill encapsulant is disposed between the semiconductor die and the interposer and around the discrete conductive elements by permitting the same to flow into the space between the die and the perimeter wall. The encapsulant may form an underfill or substantially encapsulate the semiconductor die within the recess of the interposer.

26 Claims, 2 Drawing Sheets

U.S. PATENT DOCUMENTS

| | | |
|---|---|---|
| 5,412,247 A | 5/1995 | Martin |
| 5,436,203 A | 7/1995 | Lin |
| 5,468,999 A | 11/1995 | Lin et al. |
| 5,474,458 A | 12/1995 | Vafi et al. |
| 5,696,033 A | 12/1997 | Kinsman |
| 5,714,800 A | 2/1998 | Thompson |
| 5,719,440 A | 2/1998 | Moden |
| 5,789,803 A | 8/1998 | Kinsman |
| 5,838,061 A | 11/1998 | Kim |
| 5,847,936 A | 12/1998 | Forehand et al. |
| 5,855,821 A | 1/1999 | Chau et al. |
| 5,898,224 A | 4/1999 | Akram |
| 5,942,798 A | 8/1999 | Chiu |
| 5,965,933 A | 10/1999 | Young et al. |
| 5,972,734 A | 10/1999 | Carichner et al. |
| 6,002,171 A | 12/1999 | Desai et al. |
| 6,018,462 A | 1/2000 | Sakuyama |
| 6,031,284 A | 2/2000 | Song |
| 6,048,750 A | 4/2000 | Hembree |
| 6,063,828 A | 5/2000 | Ma et al. |
| 6,081,429 A | 6/2000 | Barrett |
| 6,238,948 B1 | 5/2001 | Ramalingam |
| 6,238,949 B1 | 5/2001 | Nguyen et al. |
| 6,351,391 B1 | 2/2002 | Beliveau et al. |
| 6,362,525 B1 | 3/2002 | Rahim |
| 6,395,124 B1 * | 5/2002 | Oxman et al. ............ 156/275.5 |
| 6,433,412 B2 | 8/2002 | Ando et al. |
| 6,512,176 B2 | 1/2003 | Yaguchi et al. |
| 6,534,879 B2 | 3/2003 | Terui |
| 6,573,592 B2 | 6/2003 | Bolken |
| 6,608,379 B2 | 8/2003 | Yeo et al. |
| 6,803,646 B2 * | 10/2004 | Shibue ..................... 257/667 |
| 6,939,746 B2 * | 9/2005 | Bolken ..................... 438/127 |
| 2004/0026797 A1 | 2/2004 | Chen et al. |

FOREIGN PATENT DOCUMENTS

| | | |
|---|---|---|
| JP | 08-046079 A | 2/1996 |
| JP | 11-354664 | 12/1999 |

* cited by examiner

METHOD FOR ASSEMBLING SEMICONDUCTOR DIE PACKAGES WITH STANDARD BALL GRID ARRAY FOOTPRINT

CROSS-REFERENCE TO RELATED APPLICATIONS

This application is a continuation of application Ser. No. 10/133,250, filed Apr. 26, 2002, now U.S. Pat. No. 6,939,746, issued Sep. 6, 2005, the disclosure of which is incorporated by reference herein, which is a divisional of application Ser. No. 09/934,278, filed Aug. 21, 2001, now U.S. Pat. No. 6,573,592, issued Jun. 3, 2003.

BACKGROUND OF THE INVENTION

Field of the Invention: The present invention relates to ball grid array ("BGA") semiconductor packages and methods of attaching, encapsulating and evaluating the same. In particular, the present invention relates to interposers for mounting a BGA semiconductor die to a carrier substrate with which the BGA semiconductor die is in electrical communication, such that an underfill encapsulant may be flowed between the BGA semiconductor die and the interposer. The BGA semiconductor die may be encapsulated within the interposer to form a complete semiconductor die package. The interposer may be constructed such that semiconductor die having different patterns of BGAs may be mounted on identical substrates without a need for substrate alteration.

Definitions: The following terms and acronyms will be used throughout the application and are defined as follows:

BGA—Ball Grid Array: An array of minute solder balls disposed on an attachment surface of a semiconductor die, interposer, or semiconductor package wherein the solder balls are reflowed for simultaneous attachment and electrical communication with a substrate, such as a printed circuit board.

COB—Chip on Board: The techniques used to attach semiconductor dice to substrates, including flip chip attachment, wirebonding, and tape automated bonding ("TAB").

Flip Chip: A semiconductor die or chip having bumped bond pads on the active surface of the die and is intended for facedown mounting.

Flip Chip Attachment: A method of attaching a semiconductor die to a substrate in which the die is flipped so that the connecting conductor pads on the active surface of the die are set on mirror image pads on the substrate and bonded by reflowing solder.

Glob Top: A glob of encapsulant material (usually epoxy or silicone or a combination thereof) surrounding a semiconductor die in the COB assembly process.

Low Viscosity Encapsulant: An encapsulant material suitable for use as an underfill (usually epoxy or silicone or a combination thereof) which, prior to curing, has a relatively low viscosity, such that it may be directed to flow into and through an array of connecting bond pads of a semiconductor die attached to a substrate, with substantially no voids left therein, without the use of a pressure differential.

PGA—Pin Grid Array: An array of small pins extending substantially perpendicularly from the major plane of a semiconductor die, interposer, or semiconductor package, wherein the pins conform to a specific arrangement for attachment to a substrate.

SLICC—Slightly Larger than Integrated Circuit Carrier: An array of minute solder balls disposed on an attachment surface of a semiconductor die, interposer, or semiconductor package similar to a BGA, but having a smaller solder ball pitch and diameter than a BGA.

Flip chip attachment consists of attaching a semiconductor die, generally having a BGA, a SLICC or a PGA, to a printed circuit board or other substrate. With the BGA or the SLICC, the solder ball arrangement on the semiconductor die must be a mirror image of the connecting bond pads on the substrate such that a precise connection is made. The semiconductor die is bonded to the substrate by reflowing the solder balls. With the PGA, the pin arrangement of the semiconductor die must be a mirror image of the pin recesses on the substrate. After insertion, the semiconductor die is generally bonded by soldering the pins into place.

Once the semiconductor die has been flip chip attached to the substrate, an underfill encapsulant is generally disposed between the semiconductor die and the substrate. The underfill encapsulant is generally a fluid epoxy that may be flowed into the connection space between the semiconductor die and substrate, laterally between the soldered electrical connections. Typically, the underfill encapsulant is allowed to flow until fillets of underfill encapsulant are formed around the sides of the semiconductor die. In order to form the fillets and to prevent the underfill encapsulant from flowing further and covering other portions of the substrate, thereby reducing the "real estate" (die surface area) used by the semiconductor die connection, it has been necessary to use underfill encapsulants which have a relatively high viscosity.

Once cured, the underfill encapsulant serves multiple functions. It compensates for the difference in coefficient of thermal expansion between the substrate and the semiconductor die. It also protects the solder bumps from environmental contaminants. However, flowing an underfill encapsulant with relatively high viscosity into the connection space raises further problems. More viscous underfill encapsulants are often unable to flow in between all the connections within the connection space. Empty areas, or voids, occurring when bubbles are trapped within the connection space are common. Delaminations, where the high viscosity underfill encapsulant fails to wet and adhere to a surface, also occur. Such defects can lead to the early failure of the semiconductor die when in operation.

Attempts have been made to reduce the number of defects in the underfilling process. Typically, a vacuum is applied to facilitate the flow of underfill encapsulant into the connection space. Alternatively, or in addition to the application of a vacuum, a highly viscous underfill encapsulant may be injected under elevated pressure. Even where these techniques are used, defects can still occur. Applying a vacuum or elevated pressure can stress the solder connections, resulting in weakening or breakage thereof. The manufacturing cost of the package is also increased as additional processing steps as well as additional equipment for maintaining and applying the pressure differences are required.

With wire-bond or TAB adapted dies, a molded carrier ring may be used to protect a portion of the leads as they extend out from the semiconductor die. This is accomplished by placing a molded carrier ring around the die, with the leads protruding therefrom, then filling the molded carrier ring with an encapsulant material. The ends of the leads protruding from the ring are available for testing or connection to a substrate. While the die itself is protected, the exposed lead ends remain susceptible to breakage, moisture and contamination. Even this limited protection cannot be used with flip chip adapted semiconductor die, as the connection pads do not extend out parallel to the plane of the die.

Therefore, it would be advantageous to develop an apparatus and method that allow for use of a relatively low viscosity underfill encapsulant with flip chip attachment for semiconductor dice, reducing the rate of underfill defects while eliminating the need for a vacuum or pressurized injection. It would further be advantageous for such an apparatus and method to provide a standard connection pattern allowing for semiconductor dice having different connection patterns to be attached to a common substrate having a single set of connection terminals.

BRIEF SUMMARY OF THE INVENTION

The present invention includes apparatus and methods for preparing semiconductor packages, or assemblies. An interposer having a perimeter wall surrounding a recess on an upper surface thereof includes an array of electrical connection pads within the recess. A semiconductor die can be flip chip attached, making electrical contact through the electrical connection pads to a number of other electrical contacts accessible elsewhere on the interposer, preferably on the lower surface thereof. A low viscosity underfill encapsulant is disposed between the semiconductor die and the interposer by flowing into the space between the die and the perimeter wall of the interposer. The underfill encapsulant flows throughout the connection array by capillary action, without the assistance of either positive or negative pressure. The underfill encapsulant may be flowed until the underfill is complete, or until the entire semiconductor die is encapsulated within the interposer.

BRIEF DESCRIPTION OF THE DRAWINGS

In the drawings, which depict the best mode presently known for carrying out the invention.

DETAILED DESCRIPTION OF THE ILLUSTRATED EMBODIMENTS

Figure 1:
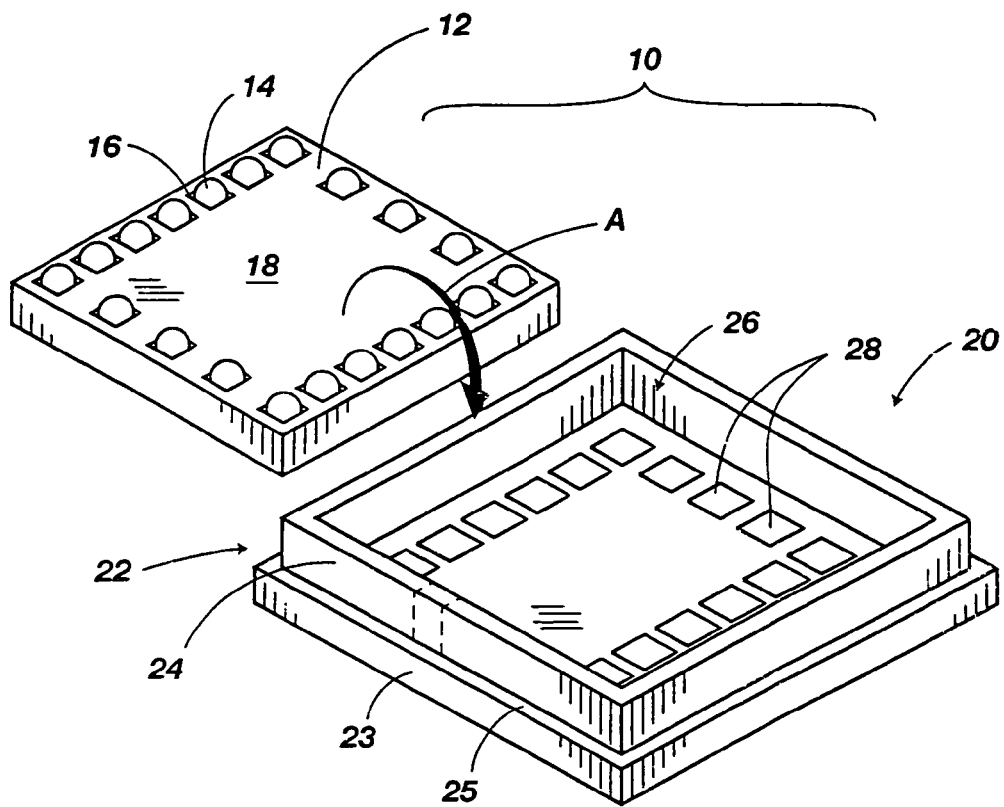
FIG. 1 is a perspective view of a semiconductor die which is about to be attached to an interposer in accordance with the present invention to form a semiconductor assembly made in accordance with the present invention.

Reference will now be made to drawing FIG. 1. Several components of a semiconductor assembly 10 in accordance with the principles of the present invention are depicted, in an unassembled manner. A semiconductor die 12, also referred to as a semiconductor chip, features a number of solder balls 14 attached to the bond pads 16 of the active surface (face) 18 thereof. As depicted, the bond pads 16 are arranged in a grid array connection pattern that, along with solder balls 14, facilitates a BGA-type connection, but it will be appreciated that a SLICC, a PGA, or any other suitable connection method may be used in connection with the bond pads 16.

An interposer 20 is used for attachment to the semiconductor die 12. Interposer 20 includes an upper surface 22, which features a perimeter wall 24 substantially encircling a recess 26 formed within upper surface 22 and configured to at least partially receive a semiconductor die 12. As shown in FIG. 1, perimeter wall 24 may form a complete structure, but may alternatively include small gaps (shown in dashed lines) therein. The perimeter wall 24 may be formed continuous with the outer edge 23 of the interposer 20 or it may be inset, as depicted by FIG. 1, to form a ledge or shoulder 25 at one or more outer edges 23 of the interposer 20. It is preferred that the interposer 20 be sized as closely as possible to the semiconductor die 12. This results in a semiconductor assembly 10 having only a marginally larger size than the bare semiconductor die 12, conserving area on a substrate to which the entire semiconductor assembly 10 is attached. The thickness of such a semiconductor assembly 10 may also be only marginally thicker than the bare semiconductor die 12.

Within the recess 26 are a number of upper electrical connection pads 28, which are arranged in a pattern corresponding to the pattern of bond pads 16 of the semiconductor die 12. When the semiconductor die 12 is installed in the recess 26, the solder balls 14 of the BGA, as illustrated in the embodiment of the invention of drawing FIG. 1, are placed on top of and in contact with upper electrical connection pads 28. The installation may be accomplished by inverting the semiconductor die 12 over the recess 26, as shown by arrow A.

Figure 2:
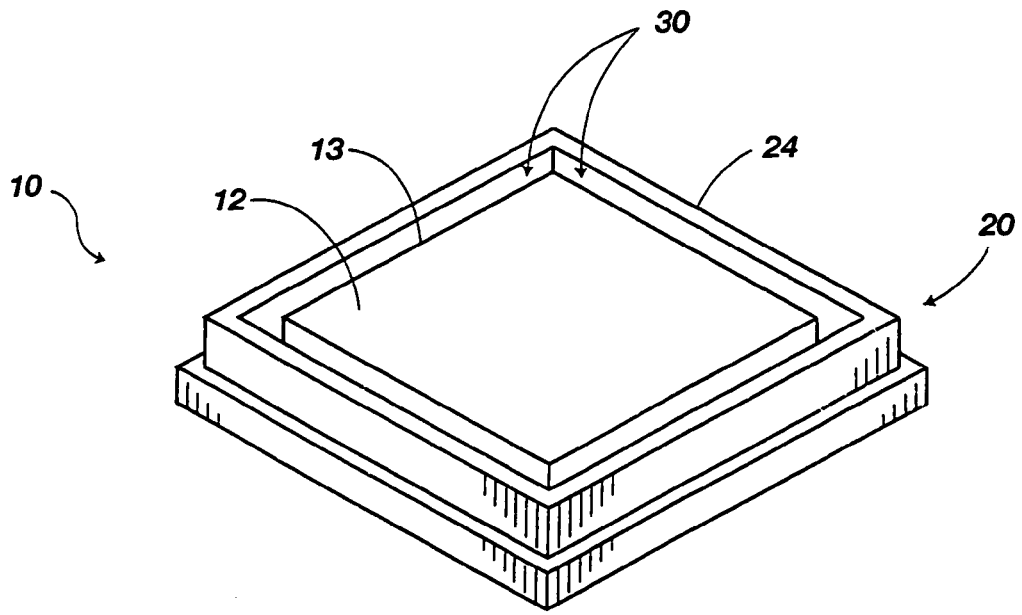
FIG. 2 is a perspective view of the semiconductor assembly of FIG. 1, after the semiconductor die has been positioned in the recess of the interposer.

Turning to drawing FIG. 2, the components of the semiconductor assembly 10 illustrated in FIG. 1 are shown with the semiconductor die 12 installed in the recess 26 of the interposer 20 and within the confines of the perimeter wall 24. The bond pads 16 (FIG. 1) of the semiconductor die 12 are positioned above their corresponding upper electrical connection pads 28 (FIG. 1) within the recess 26 of the interposer 20. In embodiments using a BGA or SLICC arrangement, the semiconductor die 12 may be joined to the interposer 20 and the bond pads 16 electrically connected to the upper electrical connection pads 28 by reflowing the solder balls 14.

As shown in drawing FIG. 2, when the semiconductor die 12 is installed in the recess 26 of the interposer 20, a flow space 30 is located between the perimeter wall 24 of the interposer 20 and the outer periphery 13 of the semiconductor die 12, providing access to the recess 26.

Figure 3:
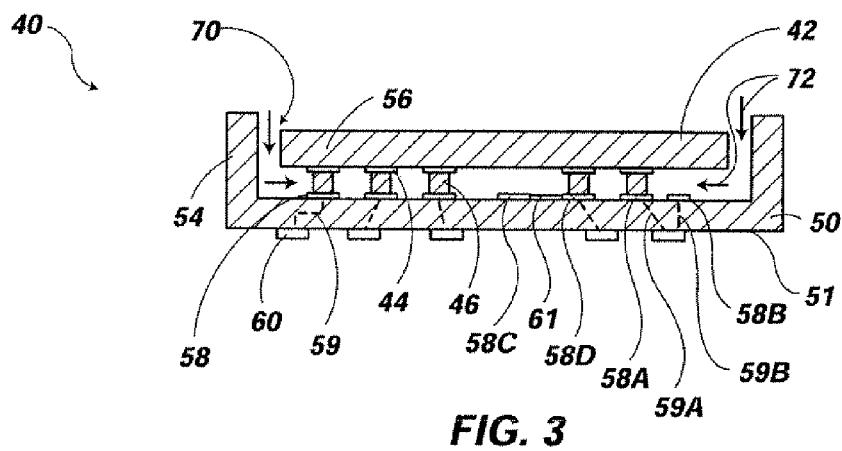
FIG. 3 is a side cross-sectional view of one embodiment of a semiconductor assembly made in accordance with the principles of the present invention.

Illustrated in drawing FIG. 3 is a cross-sectional view of a semiconductor assembly 40 including a semiconductor die 42 installed in a recess 56 of an interposer 50. Perimeter wall 54 is formed as the outer edge of the interposer 50 in the embodiment of the invention illustrated in drawing FIG. 3. The bond pads 44 of the semiconductor die 42 are attached to the upper electrical connection pads 58 within the recess 56 of the interposer 50 by reflowed solder connections 46. The upper electrical connection pads 58 communicate with lower electrical connections 60 on the lower surface 51 of the interposer 50 through electrically conductive traces 59 that pass through the interposer 50.

While it will be appreciated that electrically conductive traces 59 may be formed from any suitable electrically conductive material, and may be constructed in any suitable manner known to those skilled in the art, in some possible embodiments of the present invention, the interposer 50 may be formed using an epoxy-glass laminate such as FR-4. In such embodiments, the interposer 50 may be formed by laminating layers of FR-4 together to form the surfaces, perimeter walls 54 and recess 56 of the interposer 50. Upper electrical connection pads 58 and lower electrical connections 60 may be formed through the additive or subtractive etching of a conductive layer upon the laminate. Electrically conductive traces 59 through the interposer 50 body may be formed through laminating conductive material within the interposer 50. Alternatively, holes or recesses may be created within the interposer during lamination thereof or by mechanical means such as drilling. The holes may be used as vias 62 (FIG. 3A), or may be filled with a conductive material to form the electrically conductive traces 59.

Figure 3A:
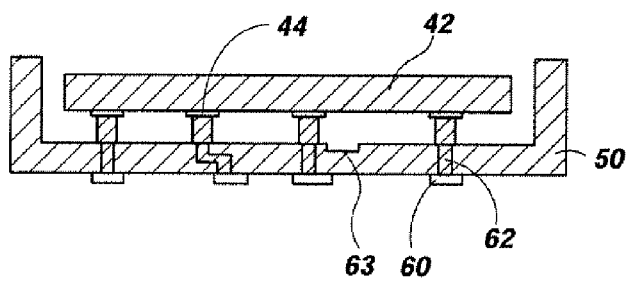
FIG. 3A is a side cross-sectional view of another embodiment of the upper electrical connection pads and electrical vias of a semiconductor assembly made in accordance with the principles of the present invention.

Illustrated in drawing FIG. 3A is another alternative embodiment structure for the upper electrical connection pads 58 and the electrically conductive traces 59 illustrated in drawing FIG. 3. A number of vias 62 are accessible within the recess 56 of the interposer 50, in a pattern corresponding to the bond pads 44 of the semiconductor die 42. Vias 62 connect to the lower electrical connections 60 of the interposer 50. As shown, once the solder connections 46 are formed by reflowing, the vias 62 are filled with solder, electrically coupling the bond pads 44 to the lower electrical connections 60.

Returning to drawing FIG. 3, the lower electrical connections 60 are preferably formed into a standard pattern to provide a standardized connection "footprint," facilitating the electrical connection of semiconductor assemblies 40 including semiconductor dice having bond pads 44 of various different connection patterns to a substrate, or a testing device, with a fixed connection pattern. Interposer 50 may include upper electrical connection pads 58 that are formed to correspond to different bond pad arrangements of different semiconductor dice. This can be accomplished in a number of ways. One set of alternate upper electrical connection pads, represented by 58A and 58B, communicates with a single lower electrical connection pad 60 through electrically conductive traces 59A and 59B. Another set of alternate electrical connection pads represented by 58C and 58D are connected by an electrically conductive trace 61 on the surface of the interposer recess 56, resulting in connection to a single electrically conductive trace 59. Electrically conductive trace 61 may be formed at the same time as the upper electrical connection pads 58. Other possible alternatives include alternate sets where a number of upper electrical connection pads 58 are connected to one or more electrically conductive traces 59. Alternate sets may be formed in connection with vias 62 (FIG. 3A) through connection of an upper electrical connection pad 58 to the via 62 through an electrically conductive trace 61 or 59, or by a channel 63 (FIG. 3A) which allows solder to flow to the via 62. It will be appreciated that a number of alternate sets of upper electrical connection pads 58 can be formed into alternate arrays and that, while alternate electrical connections include alternate pairs of upper electrical connections, they may also include three, four or any other number of sets of alternate electrical connection pads.

The arrangement of the lower electrical connection pads 60 in a single, standard footprint allows for decreased production costs in assembling products utilizing the complete packaged semiconductor assemblies 40 formed as part of the present invention. The interposer 50 may also include additional electrical components needed to allow alternative semiconductor dies 42 to be functionally used in a complete semiconductor assembly 40 including the interposer 50.

The space 70 between the semiconductor die 42 and the interposer 50 is filled by flowing an underfill encapsulant thereinto. Arrows 72 show the flow of the underfill encapsulant. The perimeter walls 54 act to restrain the flow of the underfill encapsulant to locations within the recess 56 and thereover. The distance between the perimeter wall 54 and the semiconductor die 42 determines the rate at which the underfill encapsulant may flow through and into the space 70, and between the semiconductor die 42 and the upper surface of the interposer recess 56. Preferably, the distance between each side of the semiconductor die 42 and its corresponding perimeter wall 54 is substantially equal, creating substantially equal flow restriction along each of the side surfaces of the semiconductor die 42. This allows for a low viscosity underfill encapsulant to be used and to be flowed in along two or more sides of the semiconductor die 42 at the same time. Preferably, the underfill encapsulant is flowed into the space 70 along the entire perimeter of the semiconductor die 42. The low viscosity underfill encapsulant will flow laterally between the soldered electrical connections 46 between the semiconductor die 42 and the interposer 50 by capillary action, or "wicking," to substantially fill the space 70. Flow of the underfill encapsulant is increased relative to a higher viscosity underfill encapsulant. The underfill encapsulant does not need to be injected at elevated pressure and no vacuum is required. In this way, the occurrence of underfill defects can be reduced, while additional steps and equipment are not required.

Figure 4:
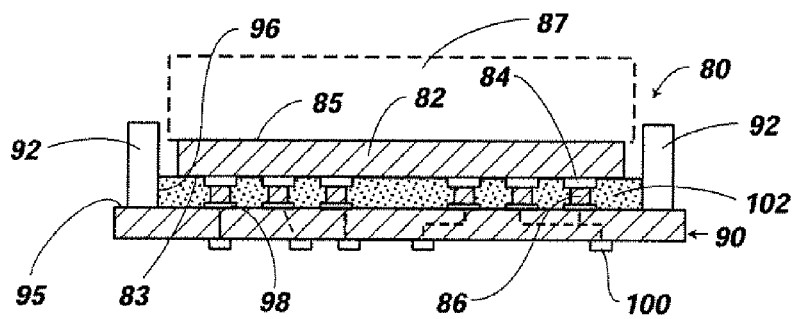
FIG. 4 is a side cross-sectional view of an alternative embodiment of semiconductor assembly made in accordance with the principles of the present invention.

Illustrated in drawing FIG. 4 is a cross-sectional view of a semiconductor assembly 80 made in accordance with the principles of the present invention. A semiconductor die 82 is installed in flip chip fashion at least partially within a recess 96 of an interposer 90 that includes a perimeter wall 92. An underfill encapsulant 102 has been flowed as described above between the semiconductor die 82 and the interposer 90. The electrical connections 86 between the bond pads 84 of the semiconductor die 82 and the upper electrical connection pads 98 of the interposer 90 are completely encapsulated, protecting the connections from moisture and contamination. The underfill encapsulant 102 has been flowed to the point where the entire first surface 83 of the semiconductor die 82 was wetted and thereby bound thereto. This reduces the physical stress on the electrical connections while leaving the second surface 85 of the semiconductor die 82 exposed. A heat sink 87 (shown in dashed lines), or other structure, may then be installed upon the second surface 85 of the semiconductor die 82. In embodiments of the present invention where the underfill encapsulant 102 extends only to the first surface 83 of the semiconductor die 82, it is preferred that the perimeter wall 92 be equal to or less than the height of the second surface 85 of the installed semiconductor die 82 to facilitate the installation of a heat sink or other structure onto the second surface 85 of semiconductor die 82.

As shown in drawing FIG. 4, the underfill encapsulant 102 may fill the entire available space around the semiconductor die 82, instead of forming fillets around the base of the semiconductor die 82. The present invention provides for the use of underfill encapsulants of such low viscosity that such fillets may not form. This increases the ability of the encapsulant to flow throughout the connections, reducing the occurrence of defects. It will be appreciated, however, that the principles of the present invention extend to the use of lower viscosity underfill encapsulants that retain the ability to form fillets, and the use of such underfill encapsulants is within the scope of the present invention.

Also illustrated in drawing FIG. 4 is an interposer 90 including a ledge 95 on the upper surface thereof and located outside the perimeter wall 92. In some variations of interposer 90, ledge 95 may carry additional electrical connection pads that may provide additional connection points or testing points for the semiconductor assembly 80.

Figure 5:
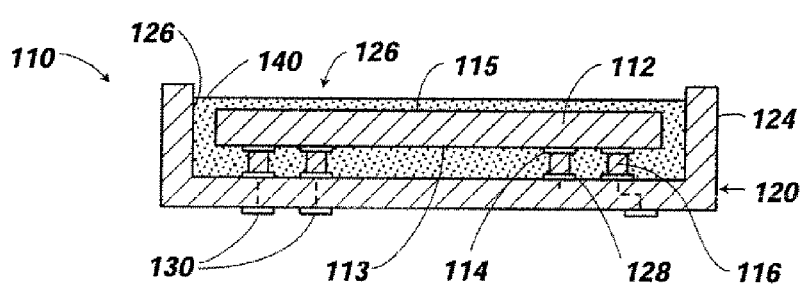
FIG. 5 is a side cross-sectional view of another embodiment of a semiconductor assembly made in accordance with the principles of the present invention.

Illustrated in drawing FIG. 5 is a cross-sectional view of another embodiment of a semiconductor assembly 110, made in accordance with the principles of the present invention. A semiconductor die 112 is positioned within a recess 126 of and flip chip bonded to an interposer 120. An underfill encapsulant 140 has been flowed between the semiconductor die 112 and the interposer 120, as described above. The electrical connections 116 between the bond pads 114 of the semiconductor die 112 and their corresponding upper electrical connection pads 128 of the interposer 120 are substantially encapsulated, protecting the electrical connections 116 from moisture and contamination. Unlike the embodiment of the present invention illustrated in drawing FIG. 4, in this embodiment of the invention, once the first surface 113 of the semiconductor die 112 is wetted by the underfill encapsulant 140, further underfill encapsulant is flowed into the recess 126, until the second surface 115 of the semiconductor die 112 is also encapsulated within the underfill encapsulant 140. The perimeter wall 124 is greater in height than the second surface 115 of the installed semiconductor die 112 to facilitate encapsulation of the second surface 115.

Once the underfill encapsulant 140 has cured, the semiconductor die 112 of the embodiment of the invention illustrated in drawing FIG. 5 is completely encapsulated, protecting it from moisture entry, contamination, and delamination. A separate glob top epoxy is not needed, eliminating both an extra step in package preparation and the need for additional materials.

A semiconductor assembly made in accordance with the principles of the present invention, such as those embodiments of the present invention illustrated in drawing FIGS. 3, 4 and 5, among others, may be attached or secured relative to a substrate (not shown) via discrete conductive elements secured to the lower electrical connection pads (represented at 60, 100 and 130 in the respective drawings). The substrate can be part of a final product into which the assembly is to be incorporated, or it may be for testing the semiconductor die. Alternatively, the assembly may be tested through the lower electrical contacts prior to attachment to a substrate. The assembly may be attached to the substrate using any COB technique known to those skilled in the art, but it is preferred to use a flip chip type of attachment, preserving the advantages of this space-saving attachment, while including the advantages of the present invention.

In accordance with the description provided herein, the present invention includes a method of forming a semiconductor assembly including an underfilled flip chip mounted die and perimeter walled interposer, comprising:

providing an interposer having an upper surface and an opposite lower surface, a perimeter wall protruding from the upper surface and substantially encircling at least a portion of the upper surface to form a recess, the recess having at least one upper electrical contact pad located therein;

providing a semiconductor die having a first surface and a second surface, the first surface including at least one bond pad thereon;

positioning the semiconductor die at least partially within the receptacle of the interposer within the recess such that the at least one bond pad is in electrical communication with the at least one upper electrical contact pad on the upper surface of the interposer and at least some of the surface area of the upper surface of the interposer is accessible between a periphery of the semiconductor die and the perimeter wall of the interposer; and disposing an underfill encapsulant onto the accessible surface area such that the underfill encapsulant flows between the first surface of said semiconductor die and the upper surface of said interposer between the periphery of the semiconductor die and the perimeter wall, encapsulating the at least one upper electrical contact pad and the at least one bond pad within the underfill encapsulant.

Further, it will be appreciated that the present invention includes a method of forming a semiconductor assembly including an interposer with a standardized footprint comprising:

providing an interposer comprising an upper surface, a perimeter wall substantially encircling the upper surface, and a recess formed by the upper surface and the perimeter wall having at least two upper electrical contacts located on the upper surface, within the recess, a pair of alternate upper electrical contacts, a lower surface having at least a first lower electrical connection located thereon, at least the first lower electrical connection in electrical connection with a first upper electrical connection and a second upper electrical connection;

positioning a semiconductor die at least partially within the recess and electrically connecting at least one bond pad thereof to one of the at least two upper electrical contacts.

It is readily evident that semiconductor assemblies made in accordance with the principles of the present invention have a reduced number of defects and are capable of being manufactured with reduced steps in assembly. Perimeter walled interposers may be sized only slightly larger than the semiconductor chip and may include a flip chip type of attachment array or other connection pattern on the lower surface thereof. Such an arrangement conserves real estate by allowing flip chip attachment of the entire structure to a substrate in an area only slightly larger than the semiconductor die. The need for applying a positive or negative pressure during assembly to facilitate flow of the underfill encapsulant and the need for a glob top encapsulant are eliminated, resulting in lower manufacturing costs.

The array of electrical connection pads in the interposer recess can be designed to facilitate electrical connection of the interposer with a number of alternative bond pad arrangements of different semiconductor dice. The resulting packages have a common footprint for attachment to a substrate. Alternative semiconductor dice capable of performing the same or similar functions can be easily substituted in the semiconductor assembly, without a need for changing the connection pattern on the substrate. This allows for more efficient installation, or testing, of the semiconductor assemblies, reducing the potential costs and time involved in utilizing the equivalent assemblies in the manufacture of products.

It will be apparent that details of the apparatus and methods herein described can be varied considerably without departing from the concept and scope of the invention. The claims alone define the scope of the invention as conceived and as described herein.

What is claimed is:

1. A method for constructing a semiconductor assembly with a common footprint using a semiconductor die selected from an equivalent set of semiconductor dice having different bond pad arrangements, the method comprising:

forming an interposer comprising an upper surface, a lower surface, a perimeter wall substantially encircling the upper surface to form a recess, at least one alternative set of upper electrical contact pads disposed in the recess, and at least a first lower electrical connection disposed on the lower surface and in direct electrical communication with each upper electrical contact pad of the at least one alternative set of upper electrical contact pads through at least one conductive pathway carried by the interposer;

selecting a semiconductor die from an equivalent set of semiconductor dice having different bond pad arrangements, such that an equivalent bond pad on the semiconductor die will be adjacent to, and in electrical communication with one upper electrical contact pad of the at least one alternative set of upper electrical contact pads upon installation; and attaching the selected semiconductor die within the recess, such that the equivalent bond pad on the semiconductor die is in electrical communication with the at least a first lower electrical connection through the one upper electrical contact pad of the at least one alternative set of upper electrical contact pads in electrical communication therewith.

2. The method according to claim 1, further comprising disposing an electrically conductive attachment compound on the at least first lower electrical connection.

3. The method according to claim 2, wherein disposing an electrically conductive attachment compound comprises disposing solder.

4. The method according to claim 3, wherein disposing solder comprises disposing solder on the at least first lower electrical connection and then reflowing the solder to form a solder ball.

5. The method according to claim 1, further comprising flowing an underfill encapsulant into the recess and between the semiconductor die and the interposer.

6. The method according to claim 5, further comprising flowing the underfill encapsulant into the recess until the semiconductor die is substantially encapsulated within the underfill encapsulant.

7. The method according to claim 5, wherein the underfill encapsulant flows without the use of a pressure differential.

8. The method according to claim 5, wherein flowing an underfill encapsulant into the recess and between the semiconductor die, and the interposer comprises flowing the underfill encapsulant such that the underfill encapsulant flows between the semiconductor die and the upper surface of the interposer by wicking around an electrically communicative connection between the semiconductor die and the interposer.

9. The method according to claim 5, wherein flowing an underfill encapsulant into the recess and between the semiconductor die and the interposer comprises flowing the underfill encapsulant into the recess along at least two sides of the semiconductor die.

10. The method of claim 9, wherein flowing the underfill encapsulant into the recess along at least two sides of the semiconductor die comprises flowing underfill encapsulant around an entire perimeter of the semiconductor die.

11. The method according to claim 1, wherein forming an interposer comprising an upper surface, a lower surface, a perimeter wall substantially encircling the upper surface to form a recess, at least one alternative set of upper electrical contact pads disposed in the recess, and at least a first lower electrical connection disposed on the lower surface and in direct electrical communication with each upper electrical contact pad of the at least one alternative set of upper electrical contact pads through at least one conductive pathway carried by the interposer comprises forming an interposer where each upper electrical contact pad of the at least one alternative set of upper electrical contact pads is in direct electrical communication with the at least a first lower electrical connection by alternate vias carried by the interposer.

12. The method according to claim 1, wherein forming an interposer comprising an upper surface, a lower surface, a perimeter wall substantially encircling the upper surface to form a recess, at least one alternative set of upper electrical contact pads disposed in the recess, and at least a first lower electrical connection disposed on the lower surface and in direct electrical communication with each upper electrical contact pad of the at least one alternative set of upper electrical contact pads through at least one conductive pathway carried by the interposer comprises forming an interposer where the each upper electrical contact pad of the at least one alternative set of upper electrical contact pads is in direct electrical communication with the at least a first lower electrical connection by alternative electrical traces carried by the interposer.

13. The method according to claim 1, wherein forming an interposer comprising an upper surface, a lower surface, a perimeter wall substantially encircling the upper surface to form a recess, at least one alternative set of upper electrical contact pads disposed in the recess, and at least a first lower electrical connection disposed on the lower surface and in direct electrical communication with each upper electrical contact pad of the at least one alternative set of upper electrical contact pads through at least one conductive pathway carried by the interposer comprises forming an interposer having a plurality of alternative sets of upper electrical contact pads disposed in the recess, and a plurality of lower electrical connections disposed on the lower surface, each upper electrical contact pad of each alternative set of upper electrical contact pads in direct electrical communication with a different lower electrical connection through at least one electrical pathway carried by the interposer.

14. A method of constructing a semiconductor assembly comprising:

providing an interposer including an upper surface, a perimeter wall substantially encircling the upper surface to form a recess, a plurality of alternative sets of upper electrical contact pads disposed in the recess, and a lower surface including at least a first lower electrical connection, each upper electrical contact pad of each alternative set of the plurality of alternative upper electrical contact pads configured for direct electrical communication with the same lower electrical connection, at least one upper electrical contact pad of each alternative set of upper electrical contact pads in direct electrical communication with the at least a first lower electrical connection through at least one conductive pathway carried by the interposer;

selecting a semiconductor die configured for attachment to at least a first alternative set of upper electrical contact pads of the plurality of alternative sets of upper electrical contact pads disposed in the recess, such that an equivalent bond pad on the semiconductor die is in electrical communication with the at least a first lower electrical connection through the at least one upper electrical contact pad of the at least a first alternative set of upper electrical contact pads in electrical communication therewith; and attaching the selected semiconductor die within the recess.

15. The method of claim 14, further comprising forming an electrical communication between at least a first bond pad on the semiconductor die and one upper electrical contact pad of the alternative set of upper electrical contact pads.

16. The method of claim 14, further comprising flowing an underfill encapsulant into the recess and between the semiconductor die and the interposer.

17. The method of claim 16, further comprising flowing the underfill encapsulant into the recess until the semiconductor die is substantially encapsulated within the underfill encapsulant.

18. The method of claim 16, wherein the underfill encapsulant flows without the use of a pressure differential.

19. The method of claim 16, wherein flowing an underfill encapsulant into the recess and between the semiconductor die, and the interposer comprises flowing the underfill encapsulant such that the underfill encapsulant flows between the semiconductor die and the upper surface of the interposer by wicking around an electrically communicative connection between the semiconductor die and the interposer.

20. The method of claim 16, wherein flowing an underfill encapsulant into the recess and between the semiconductor die and the interposer comprises flowing the underfill encapsulant into the recess along at least two sides of the semiconductor die.

21. The method of claim 20, wherein flowing the underfill encapsulant into the recess along at least two sides of the semiconductor die comprises flowing underfill encapsulant around an entire perimeter of the semiconductor die.

22. The method of claim 14, further comprising disposing an electrically conductive attachment compound on the at least first lower electrical connection.

23. The method of claim 22, wherein disposing an electrically conductive attachment compound comprises disposing solder.

24. The method of claim 23, wherein disposing solder comprises disposing solder on the at least first lower electrical connection and then reflowing the solder to form a solder ball.

25. The method of claim 14, wherein providing an interposer including an upper surface, a perimeter wall substantially encircling the upper surface to form a recess, a plurality of alternative sets of upper electrical contact pads disposed in the recess, and a lower surface including at least a first lower electrical connection, each upper electrical contact pad of each alternative set of upper electrical contact pads configured for direct electrical communication with a single lower electrical connection, at least one upper electrical contact pad of each alternative set of upper electrical contact pads in direct electrical communication with the at least a first lower electrical connection through at least one conductive pathway carried by the interposer comprises providing an interposer where the at least one upper electrical contact pad of each alternative set of upper electrical contact pads are in direct electrical communication with the at least a first lower electrical connection by alternative electrical traces carried by the interposer.

26. The method of claim 14, wherein providing an interposer including an upper surface, a perimeter wall substantially encircling the upper surface to form a recess, a plurality of alternative sets of upper electrical contact pads disposed in the recess, and a lower surface including at least a first lower electrical connection, each upper electrical contact pad of each alternative set of upper electrical contact pads configured for direct electrical communication with a single lower electrical connection, at least one upper electrical contact pad of each alternative set of upper electrical contact pads in direct electrical communication with the at least a first lower electrical connection through at least one conductive pathway carried by the interposer comprises providing an interposer where the at least one upper electrical contact pad of each alternative set of upper electrical contact pads are in direct electrical communication with the at least a first lower electrical connection by alternate vias carried by the interposer.

\* \* \* \* \*